United States Patent [19]

Steinmann

[11] Patent Number: 4,495,476
[45] Date of Patent: Jan. 22, 1985

[54] SAWTOOTH VOLTAGE GENERATOR

[75] Inventor: Helmut Steinmann, Baden-Baden, Fed. Rep. of Germany

[73] Assignee: Robert Bosch GmbH, Stuttgart, Fed. Rep. of Germany

[21] Appl. No.: 414,365

[22] PCT Filed: Nov. 6, 1981

[86] PCT No.: PCT/DE81/00193
§ 371 Date: Aug. 26, 1982
§ 102(e) Date: Aug. 26, 1982

[87] PCT Pub. No.: WO82/02807
PCT Pub. Date: Aug. 19, 1982

[30] Foreign Application Priority Data

Feb. 13, 1981 [DE] Fed. Rep. of Germany ....... 3105253

[51] Int. Cl.³ .................. H03K 3/023; H03K 4/08
[52] U.S. Cl. ........................ 331/111; 331/143
[58] Field of Search ............... 331/111, 143, 108 D; 307/228; 328/185, 181

[56] References Cited

U.S. PATENT DOCUMENTS 3,185,889  5/1965  Attwood ..................... 315/389
3,678,332  7/1972  Boekhorst .................. 328/185 X

FOREIGN PATENT DOCUMENTS 2855332  6/1980  Fed. Rep. of Germany .

OTHER PUBLICATIONS

Vazhenina, "Sawtooth Voltage Generator With Correcting Circuits", Telecommunications and Radio Engineering, vol. 27, No. 4, Apr. 1972, pp. 120-122.

Primary Examiner—Siegfried H. Grimm
Attorney, Agent, or Firm—Frishauf, Holtz, Goodman & Woodward

[57] ABSTRACT

The sawtooth voltage generator is intended in particular for use as a clock and reference voltage generator of an electronic regulating means for a motor vehicle heating system. The generator has an output voltage having a leading edge determined by a first RC circuit and a trailing edge determined by a further RC circuit. A first capacitor (C1) and a second capacitor (C3) are charged rapidly; the second capacitor (C3) has its own discharging circuit, e.g. a resistor (R7). The curve form of the trailing edge of the output voltage can be substantially freely determined with a nonlinear wave shape which is suitable for compensating for non-linear characteristics of elements of a regulating apparatus intended for receiving the output voltage with the operating frequency being determined by the discharge circuit (R4), the first capacitor (C1). The RC member (C3, R7) which determines the trailing edge of the output voltage is coupled for charging, by a diode (D2), to the first capacitor (C1) so that two capacitors (C1, C3) can be charged very rapidly, substantially via a single low-resistance charging resistor (R5).

9 Claims, 2 Drawing Figures

SAWTOOTH VOLTAGE GENERATOR

The invention relates to a sawtooth voltage generator which is particularly switchable as a clock and reference voltage generator of an electronic regulation means for a motor vehicle heating system.

BACKGROUND

A sawtooth voltage generator has already been proposed, in which the output voltage is picked up at a capacitor which could be charged via a first resistor of low resistance and discharged via a second resistor of higher resistance and with a longer time constant. The result is the equivalent of two RC circuits or members, in which the capacitor, i.e. the C member is the same for both circuits, but the resistors, i.e. the R members were different. The first RC circuit, upon charging the capacitor, determines the leading edge; the second, or further RC member, upon discharge of the capacitor, the trailing edge of the sawtooth voltage. This sawtooth voltage generator thus had a very steeply rising leading edge of the sawtooth voltage because of the low-resistance charging resistor, and thus the clock time was determined almost exclusively by the discharging time constant of the discharging circuit of the capacitor.

THE INVENTION

It is an object to provide a sawtooth wave generator in which the frequency or repetition or cycling time of the sawtooth wave is selectable independently of the wave shape of the sawtooth wave.

Briefly, two capacitors are provided, connected to a common charging circuit which is of low resistance, so that the two capacitors are, effectively, rapidly and practically instantaneously charged to a predetermined charge voltage. A first one of the capacitors is connected to a discharge circuit which includes a resistor, the discharge circuit resistor, in combination with the capacitor, defining the time constant or timing or frequency of the sawtooth wave generator. The second capacitor is discharged by an independent discharge circuit, decoupled from the first discharge circuit, for example through a second resistor which may well have a value differing from the first, and to a voltage level which may differ from that of the first, for example being somewhat higher. The wave shape of the second capacitor-resistor discharge circuit then may well differ from that of the first; yet, the cycling time is governed by the first. The wave shape of the discharge circuit is derived, for example, from across the second capacitor. The second capacitor cannot, however, resume a charging cycle until the first capacitor is completely discharged so that, regardless of the discharge wave shape of the second capacitor, the cycling time or frequency of operation of the sawtooth generator is determined by the first capacitor—first discharge resistor network.

The sawtooth voltage generator has the advantage over the prior art that the shape of the curve of the trailing edge can be adjusted independently of the cycling or clock time of the generator. This curve form is variable within wide limits tending in the direction of greater curvature, and the dimensions of the circuitry components are entirely uncritical. A steady curve course can be obtained, without sharp bends. The trailing edge can have a substantially freely selectable nonlinearity, which can be utilized for attaining particular effects in a subsequently disposed regulating apparatus.

The sawtooth voltage generator according to the invention is particularly suitable for use in an electronic heating regulation means, as a clock generator and reference voltage generator for the pulse-width modulation of an output signal. With previously known circuits in sawtooth voltage generators for this purpose, it was not possible to exert notable influence on the curve form of the sawtooth voltage, yet it is necessary to do so when such a generator is used in an electronic heating regulation apparatus, in order to generate a suitable nonlinearity of the trailing edge of the sawtooth voltage so as to compensate for the nonlinearity of an adjusting member used. Non-linearities of a heat exchanger and a hot-water valve are compensated by this circuit. In designing an operationally reliable, simple circuit, it is particularly advantageous if the first capacitor is chargeable in a manner known per se to approximately the same voltage as the further, or second capacitor, via the same low-resistance charging circuit. The second capacitor is discharged via a separate discharging circuit to a higher voltage, with a substantially freely selectable time constant. In accordance with a feature of the invention, the necessary output voltage is efficaciously generated by means of an operational amplifier functioning as a comparator, the direct, or non-inverting input of which is located at the connecting point of a reference voltage divider connected to a direct-voltage supply source and the output of which is positively fed back to the non-inverting input via an ohmic resistor on the one hand and negatively fed back via a time-delay element e.g. a resistor on the other. An embodiment of this kind, known per se, for the basic circuit layout according to the invention makes it possible to design an operationally reliable and simple circuit using only a few components. The first capacitor is discharged in the vicinity of the end of trailing edge of the sawtooth wave, in the direction of the ground potential connected to the output of the operational amplifier, while a voltage greater than zero is prespecified as the discharge voltage for the further capacitor. The apparatus is advantageously designed such that the further capacitor discharges, during the discharge period, to the reference voltage of the lower switching threshold of the operational amplifier.

DRAWING

FIG. 1 shows a circuit in simple form, and
FIG. 2 is, a voltage diagram for this circuit.

DESCRIPTION OF THE EXEMPLARY EMBODIMENT

Figure 1:
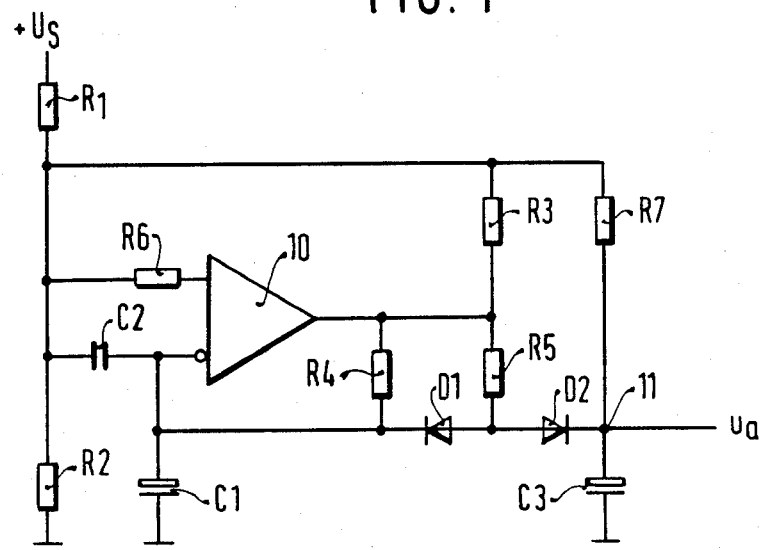

In FIG. 1, a direct-voltage supply apparatus is indicated by the symbol $U_s$, which is preferably the on-board electrical system of a motor vehicle. The direct voltage is connected to one terminal of a resistor R1, the other terminal of which is connected with a second voltage-divider resistor R2, which in turn is connected to ground or chassis. The direct, or non-inverting input of an operational amplifier 10 is connected via a resistor R6 to the junction, or connecting line between the resistors R1 and R2, and the inverting input of the operational amplifier 10 is connected via a capacitor C2 to the same junction or connecting line. The output of the operational amplifier 10 is positively fed back on the one hand to the reference voltage divider R1, R2 via a resistor R3 and is negatively fed back on the other to its inverting input via a resistor R4 and a parallel series circuit comprising a resistor R5 and a diode D1 in which resistor R5 has substantially lower resistance than resistor R4. The inverting input of the operational amplifier 10 is furthermore connected via a capacitor C1 to ground or chassis.

The anode of a diode D2 is furthermore connected to the connecting point or junction of the resistor R5 and the anode of the diode D1, while the cathode of the diode D2 is located at a connecting point or junction 11. The sawtooth-like output voltage $U_a$ is picked up at this junction 11. One electrode of a capacitor C3, the other electrode of which is connected to ground or chassis potential, is also connected to this junction 11, as is one end of a further resistor R7, the other end of which is again located at the connecting line between the voltage divider resistors R1 and R2.

The capacitor C2 at the inverting input of the operational amplifier 10 serves to suppress interference voltages; the resistor R6 at the non-inverting input of the operational amplifier 10 acts as a means of protection from voltage peaks.

OPERATION

When the direct-voltage supply apparatus $U_s$ is switched ON, positive potential reaches the non-inverting input of the operational amplifier 10; the capacitor C1 is uncharged. On account of the voltage difference existing between the two inputs of the operational amplifier, the maximum output voltage, which is approximately equal to the positive supply voltage, is present at its output, so that the capacitor C1 is charged via the resistors R4 and R5. The resistor R5 is of substantially lower resistance than the resistor R4, so that practically no charging current flows via R4 into the capacitor C1. At the same time, a charging current flows via the same resistor R5, at practically the same level, and via the diode D2 into the capacitor C3. This capacitor is thus charged within the same time, to the same voltage, as is the capacitor C1; this may be seen in the area of the leading edge in the diagram of FIG. 2.

After a very brief charging time, the difference at the two inputs of the operational amplifier has become so slight that the upper switching threshold is attained. The output of the operational amplifier jumps to the minimal output voltage value, which is approximately equal to ground or chassis potential. From this instant on, the capacitor C1 is discharged toward ground via the resistor R4, and the capacitor C3 is discharged via the resistor R7 in the direction of a voltage which is higher than zero volts.

The resistor R3 acts as a positive feedback resistor upon the reference voltage divider R1, R2. The resistors R4 and R5 as well as the diode D1 and the capacitor C1 provide the negative feedback of the operational amplifier 10. Since the charging of the capacitor C1 is effected particularly rapidly via the resistor R5 of very low resistance and via the diode D1, as may be seen from the steeply rising edge of the sawtooth voltage in FIG. 2, the clock time of the generator is determined virtually exclusively by the discharging time constant derived from the resistors R4 and C1.

Figure 2:
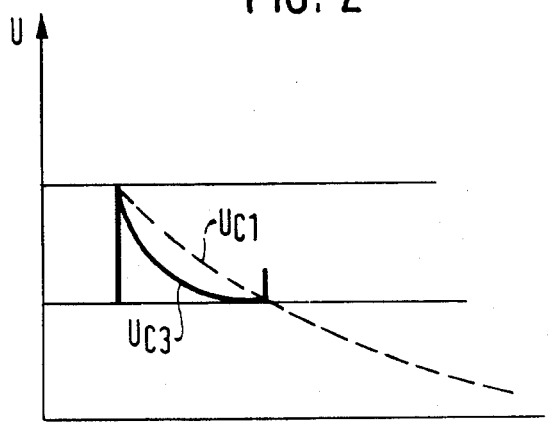

In order to obtain a curve form of the trailing edge of the sawtooth voltage which is freely adjustable within wide limits, the circuit including the resistor R7, the diode D2 and the capacitor C3 is provided, all connected to the on-board network. The capacitor C3 is charged, during the charging time of the capacitor C1, to virtually the same voltage as that of capacitor C1 via the resistor R5 of low resistance and the diode D2. The two voltage peaks in FIG. 2 thus coincide. The charging current of the capacitor C3 flowing over the resistor R7 is negligible, as is the slight difference, dictated by manufacturing tolerances, between the two diodes D1 and D2 which are of the same type. During the discharging time of the capacitor C1, the further capacitor C3 also discharges, but not via the resistor R4 toward the ground or chassis potential at the output terminal of the operational amplifier as does the capacitor C1, but rather via the resistor R7 to a voltage greater than zero volts—for instance, to the reference voltage of the lower switching threshold of the operational amplifier. The condition here is that this lower switching threshold, represented by the resistors R1, R2 and R3, be of sufficiently low resistance or that it be uncoupled with respect to the discharging resistor R7, perhaps via a further operational amplifier (not shown) which functions as a voltage follower. Since the discharging time constant for the layout comprising the resistor R7 and the capacitor C3 is adjustable entirely independently of the time constant of the member which determines the clock time and which is made up of the resistor R4 and the capacitor C1, a sawtooth voltage having virtually any arbitrary, sharply pointed curve form or a more sharply bent curvature than at the capacitor C1 can be generated at the capacitor C3. The voltage dropping at the capacitor C1 is indicated in FIG. 2 by dashed lines and clearly shows the difference in the nonlinearity of the curves. By means of the circuit layout according to the invention, it becomes possible to make the curve form of the trailing edge of the sawtooth voltage freely adjustable, in accordance with the desired nonlinearity, so as to compensate for other nonlinearities of a regulating apparatus.

Alternative circuitry to the operational amplifier 10 may be embodied in such a manner that the amplifier is made up of discrete transistors.

I claim:

1. A sawtooth voltage generator, particularly for use as a clock and a reference voltage generator for an electronic regulating apparatus for a motor vehicle, having
   a source of voltage ($U_S$);
   means (10) coupled to the voltage source and providing a charging voltage;
   and comprising
   a first capacitor (C1);
   a second capacitor (C3);
   a common low-resistance charging resistor (R5) connecting the charging voltage providing means (10) to said first and second capacitors (C1, C3) to charge said capacitors to substantially the same charge voltage;
   a first discharge circuit (R4) coupled to the first capacitor (C1) and to a reference voltage, and defining, with said first capacitor, a first discharge time constant;
   a second discharging circuit (R7) coupled to the second capacitor and to a voltage which differs from said reference voltage level, and defining, with said second capacitor, a second discharge time constant;
   means (D1, D2) effectively decoupling said first and second discharge circuits from each other and from said common charging resistor (R5);
   and means deriving a sawtooth output voltage wave (Ua) having a wave form representative of the discharge wave form ($U_{C3}$) of said second capacitor (C3) and a time constant depending on the longest one of the discharge time constants, to permit freely selecting the time constant of the sawtooth output voltage wave ($U_A$) and freely selecting the wave form of the sawtooth output voltage wave based on a discharge time constant of the second discharge circuit (R7) for the second capacitor, while permitting maintaining the cycling time constant or frequency of operation of the sawtooth output voltage wave (Ua) of the first discharge circuit (R4) of the first capacitor (C1).

2. Sawtooth voltage wave generator as defined in claim 1, wherein said decoupling means comprises two diodes (D1, D2) respectively connected and poled to permit charging current to flow from said common low-resistance charging resistor (R5) to, respectively, the first capacitor (C1) and the second capacitor (C3), while decoupling the discharge circuits (R4, R7) for said capacitors from each other.

3. Sawtooth voltage wave generator as defined in claim 1, further comprising an operational amplifier (10) connected as a comparator, and having a direct input and an inverting input;

a voltage divider (R1, R2) connected between the voltage source ($U_s$) and reference potential, the voltage divider having a common junction or tap point, the common junction being connected to the direct input of the operational amplifier;

a positive feedback connection (R3) from the output of the operational amplifier to the common junction or tap point of the voltage divider;

and a negative feedback connection (R5, R4, D1) from the output of the operational amplifier to the inverting input thereof, said negative feedback connection including the first discharge circuit (R4) and being coupled to said first capacitor (C1).

4. Sawtooth voltage wave generator as defined in claim 3, wherein said second discharge circuit comprises a resistor (R7) coupled to the common junction or tap point of the voltage divider.

5. Sawtooth voltage wave generator as defined in claim 1, wherein the voltage to which the second discharge circuit (R7) discharges the second capacitor (C3) is at a level higher than said reference level.

6. Sawtooth voltage wave generator as defined in claim 1, wherein said first and second discharge circuits, each, comprise separate resistors (R4, R7);

and the decoupling means comprise diodes (D1, D2) poled and connected to permit charging current to flow from said common low-resistance charging resistor (R5) to the first capacitor (C1) and to the second capacitor (C3), respectively, but blocking discharge current from flowing therethrough to permit discharge of the respective capacitors through the respective discharge resistors (R4, R7).

7. Sawtooth voltage wave generator as defined in claim 6, further comprising an operational amplifier (10) connected as a comparator, and having a direct input and an inverting input;

a voltage divider (R1, R2) connected between the voltage source ($U_s$) and reference potential, the voltage divider having a common junction or tap point, the common junction being connected to the direct input of the operational amplifier;

a positive feedback connection (R3) from the output of the operational amplifier to the common junction or tap point of the voltage divider;

and a negative feedback connection (R5, R4, D1) from the output of the operational amplifier to the inverting input thereof, said negative feedback connection including the first discharge circuit (R4) and being coupled to said first capacitor (C1).

8. Sawtooth voltage wave generator as defined in claim 7, wherein the voltage to which the second discharge circuit (R7) discharges the second capacitor (C3) is at a level higher than said reference level.

9. Sawtooth voltage wave generator as defined in claim 7, wherein said second discharge circuit comprises a resistor (R7) coupled to the common junction or tap point of the voltage divider.

* * * * *